United States Patent
Boutami et al.

(10) Patent No.: US 10,224,444 B2
(45) Date of Patent: Mar. 5, 2019

(54) PHOTODIODE

(71) Applicant: COMMISSARIAT A L'ENERGIE ATOMIQUE ET AUX ENERGIES ALTERNATIVES, Paris (FR)

(72) Inventors: Salim Boutami, Grenoble (FR); Karim Hassan, Moneteau (FR); Bayram Karakus, Saint Martin d'Heres (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/728,728

(22) Filed: Oct. 10, 2017

(65) Prior Publication Data
US 2018/0102448 A1     Apr. 12, 2018

(30) Foreign Application Priority Data
Oct. 10, 2016   (FR) ...................... 16 59767

(51) Int. Cl.
| H01L 31/107 | (2006.01) |
| H01L 31/0352 | (2006.01) |
| G02B 6/12 | (2006.01) |
| H01L 31/105 | (2006.01) |
| H01L 31/028 | (2006.01) |

(52) U.S. Cl.
CPC .... *H01L 31/03529* (2013.01); *G02B 6/12004* (2013.01); *H01L 31/028* (2013.01); *H01L 31/105* (2013.01); *H01L 31/107* (2013.01); *H01L 31/1075* (2013.01)

(58) Field of Classification Search
None
See application file for complete search history.

(56) References Cited

U.S. PATENT DOCUMENTS

| 2008/0310790 A1 | 12/2008 | Wu et al. |
| 2015/0069565 A1 | 3/2015 | Na |
| 2016/0126381 A1* | 5/2016 | Wang ................ H01L 31/03522 257/429 |
| 2016/0254407 A1 | 9/2016 | Wang et al. |

FOREIGN PATENT DOCUMENTS

| JP | 2006-173329 A | 6/2006 |
| JP | 2014-216549 A | 11/2014 |

OTHER PUBLICATIONS

French Search Report and Written Opinion dated Sep. 6, 2017 in Patent Application No. 1659767 (with English Translation of Category of Cited Documents).

(Continued)

*Primary Examiner* — Calvin Y Choi
(74) *Attorney, Agent, or Firm* — Oblon, McClelland, Maier & Neustadt, L.L.P.

(57) ABSTRACT

A photodiode contains an absorption portion, wherein the absorption portion contains a sheath, containing at least two charge extraction regions; and a core surrounded at least partially by the sheath. The core contains a plurality of patterns formed from a first material which generates, by absorption of photons, free electrical charge carriers and a confinement layer inside of which the patterns are located. Moreover, the patterns are arranged periodically along a main extension direction De (z) of the core, by having a pitch p.

22 Claims, 10 Drawing Sheets

(56) References Cited

OTHER PUBLICATIONS

Virot et al., "Germanium Avalanche Receiver for Low Power Interconnects", Nature comm. 5(4957), Sep. 18, 2014, pp. 1-6.

J. Bock et al., "Subwavelength Grating Periodic Structures in Silicon-on-insulator: A New Type of Microphotonic Waveguide", Optics Express, vol. 18, No. 19, Sep. 13, 2010, pp. 20251-20262.

Laurent Vivien et al., "Zero-bias 40Gbit/s Germanium Waveguide Photodetector on Silicon", Optics Express, vol. 20, No. 2, Jan. 16, 2012, pp. 1096-1101.

M. Takenaka et al., "Dark Current Reduction of Ge Photodetector by $GeO_2$ Surface Passivation and Gas-phase Doping", Optics Express, vol. 20, No. 8, Apr. 9, 2012, pp. 8718-8725.

Y. Kang et al., "Monolithic Germanium/silicon Avalanche Photodiodes with 340 GHz Gain-bandwidth Product", Nature Photonics, vol. 3, Jan. 2009, pp. 59-63.

B. Szelag et al., "Multiple Wavelength Silicon Photonic 200mm R&D Platform for 25Gb/s and Above Applications", Proc. of SPIE, vol. 9891, 2016, pp. 98911C-1-98911C-15.

G. Denoyer et al., "Hybrid Silicon Photonic Circuits and Transceiver for 50 Gb/s NRZ Transmission Over Single-Mode Fiber", Journ. of Lightw. Technol., vol. 33, No. 6, Mar. 15, 2015, pp. 1247-1254.

Handbook of Optical Constants of Solids, vol. III, p. 132, Hacene Boukari and Nicholas Lagakos, Edited by: Edward D. Palik (ISBN: 978-0-12-544415-6), 1998, 1 page.

J. Michel et al., "High-performance Ge-on-Si Photodetector ", Nature Phot., vol. 4, Aug. 2010, pp. 527-534.

\* cited by examiner

Detail A

Detail B

PHOTODIODE

TECHNICAL FIELD OF THE INVENTION

The invention relates in general to photodiodes.

It will have for particularly advantageous application the field of photodiodes. It further confers significant advantages when it is applied to avalanche photodiodes.

PRIOR ART

Conventionally a photodiode comprises an absorption portion inside of which photons are introduced to generate electric charge carriers. This absorption portion is generally done in germanium (Ge).

In light of the absorption coefficient of the germanium, the photodiode must have a length, taken along the direction of propagation of the light, that is relatively substantial to absorb a satisfactory quantity of light and therefore to perform well in terms of sensitivity. This length has a direct impact on the size of the bandwidth of the photodiode. Indeed the length of the absorption portion decreases the size of the bandwidth.

It is therefore necessary to find a compromise between absorptivity and bandwidth.

Certain photodiodes, qualified as double heterojunction photodiodes, provide to confine the material responsible for the absorption of the photons and their transformation into charge carriers, inside a sheath. This type of photodiode is shown in FIGS. 1 and 2a to 2c.

In this type of photodiode, a first waveguide, qualified as an injection guide 100, is formed on the one hand from a silicon (Si) core 110 inside of which the light beam is intended to propagate and on the other hand from a sheath 120 of silica ($SiO_2$) surrounding the core 110. The photodiode comprises a second waveguide, qualified as absorption portion 200, within which is carried out the absorption of the photons, the generation of electric charges and the extraction of the latter. This second guide formant absorption portion 200 comprises an intrinsic germanium (Ge-i) core 210 and a sheath 220 having two extraction regions 221, 222 of silicon (Si) respectively n-doped and p-doped and located on either side of the core 210. This is more precisely the germanium core 210 which acts as a conversion region since it absorbs the photons and makes the electric charge carriers mobile.

This type of photodiode makes it possible to limit the distribution of the light rays in the sheath 220 and to confine them better inside the germanium core 210. This contributes in improving the absorptivity of the photodiode and therefore its sensitivity with respect to standard photodiodes.

However, FIGS. 1 and 2c diagrammatically show simulations, a portion 320 of the light waves that penetrate into the second guide 200 is diffused in the sheath 220 in the portions 221, 222. These diffused light waves 320 are therefore not absorbed by the germanium core 210 and as such limit the performance of the photodiode in terms of responsiveness.

This type of double heterojunction photodiode has provided significant improvements in relation to conventional photodiodes.

However, in order to reach a satisfactory absorptivity, the absorption portion of these double heterojunction photodiodes must inevitably have a substantial length, which limits in a detrimental manner the size of the bandwidth.

For example, so that a Si-n/Ge-i/Si-p photodiode as described hereinabove and shown in FIGS. 1 to 2c absorbs 90% of a light of which the wavelength λ is 1.55 μm ($10^{-6}$ meters) (with this wavelength corresponding to a typical wavelength in the field of telecommunications), the germanium core 210 must have a length, along the z axis, of nearly 100 μm.

There is therefore a need that consists in proposing a solution in order to reduce the length of the absorption portion of a photodiode without however limiting the size of its bandwidth too significantly.

Such is the objective of this invention.

The other objects, characteristics and advantages of this invention shall appear when examining the following description and accompanying drawings. It is understood that other advantages can be incorporated.

SUMMARY OF THE INVENTION

According to an embodiment, the invention concerns a photodiode that comprises at least one absorption portion, with the absorption portion comprising at least one core preferably surrounded at least partially by a sheath comprising at least two charge extraction regions, with the core comprising:
- a plurality of patterns formed from a first material having the property to generate within it electric charge carriers that have been released from an absorption of photons;
- a confinement layer inside of which the patterns are located, with the confinement layer being formed from a second material that is different from the first and able to be made electrically conductive.

Moreover, the patterns are arranged periodically along a main extension direction De (z) of said core, by having a pitch p.

As such, the invention provides a core structured by inclusions of a photon converting material. The core of the absorption portion is not homogeneous. The one-off inclusions of the first material along the main direction De and according to a low pitch p generate multiple reflections of the photons by limiting the propagation by diffraction in the extraction regions. The path traveled by the photons is as such extended. The structuring of the core by the plurality of patterns arranged as such allows for a slowing down of the propagation of the luminous flux. The light is then absorbed over a shorter distance according to the main direction De (z).

Preferably the pitch p of the patterns is sufficiently low so that the propagation of the luminous flux is carried out primarily and according to a slow light phenomenon, i.e. without diffraction in the sheath. The propagation along the main direction De (z) is then carried out as if the core were homogeneous although in reality it comprises multiple inclusions in a confinement layer.

As such the invention makes it possible to improve the absorptivity of the photodiode without having to extend its length and therefore without reducing its bandwidth.

In other words, at a constant absorptivity and therefore constant sensitivity, the invention makes it possible to reduce the length of the photodiode and therefore to increase the size of its bandwidth.

This result, of which the details will be provided in what follows, is entirely counter-intuitive. Indeed, it was foreseeable that a reduction in the quantity of absorbent material would lead to a decrease in the absorptivity. In no way was it able to be considered that reduction in the quantity of absorbent material would not substantially degrade the absorptivity. A fortiori, it was not provided that this reduction in the quantity of absorbent material could lead to an increase in absorptivity.

Moreover, this photodiode structure has the advantage of reducing the dark current, with the dark current being the current generated by the photodiode even in the absence of photons.

Moreover, according to an optional embodiment, the patterns extend primarily according to a direction Dm forming with a direction Dp (x) perpendicular to said main direction De (z) an angle θ such that 90>θ>0 and preferably 80>θ>10.

As such, according to this privileged embodiment, the patterns of absorbent material are inclined. This makes it possible, for a given period p of the patterns and for a given width $W_2$ of the core 210, to have patterns of which the largest length is increased. With the invention the largest dimension of the patterns has as such a length L such that $L^2=W_2^2+p^2$ (if the height h of the pattern along the direction De (z) is equal to the pitch p).

With non-inclined patterns, this dimension L would have been equal to $W_2$.

As such, for the same core width $W_2$, the inclination of the patterns makes it possible to release the dimensional constraints over the length of the patterns, taken along their largest extension dimension Dm. This has a significant advantage in terms of the manufacturing method, in particular when the core 210 has a low width $W_2$.

Moreover, when the photodiode is of the avalanche photodiode type the invention has for advantage to substantially reduce the excess noise.

As shall be detailed in what follows in the description of the figures, this noise is due to the multiplication of the charge carriers, in particular in the absorbent material usually made from germanium, under the effect of a substantial electric field.

Conventionally in a photodiode, by application of a voltage, it is possible to displace the charger carriers that have been released.

A conventional avalanche photodiode is shown in FIGS. 3a and 3b.

As it appears in these figures, the photodiode comprises extraction regions 221, 222 made of Si-n+ and Si-p+ doped silicon located on either side of the intrinsic germanium (Ge-i) core 210. The electrodes 250, 251 are connected to the extraction regions 221, 222. Moreover, the photodiode comprises between the core 210 and the Si-n+ doped silicon extraction region 221, an intrinsic silicon multiplication layer 231.

By applying a substantial electric field, the charge carriers that have been released in the Ge-i core 210 are set into motion, are accelerated and their energy makes it possible to ionise atoms present in the multiplication layer 231, multiplying therefore the number of charge carriers. This avalanche phenomenon as such makes it possible to increase the current generated by absorbed photon and therefore to improve the sensitivity of the photodiode.

A difficulty with this type of photodiode is that the substantial electric field has as a negative impact of favouring ionisation in the Ge-i core 210. A random multiplication therefore takes place in the core 210 and this random nature is much more substantial in germanium than in silicon.

This results in that the multiplication in the Ge results in a excess noise ratio that is much more substantial than in the Si.

In order to limit this excess noise, certain solutions from prior art provide a p-doped silicon charge layer 230, arranged between the Si-n+ doped silicon extraction region 221 and the intrinsic silicon multiplication layer 231. This type of structure is usually designated by the acronym SACM (Separate Absorption Charge and Multiplication).

This structure with a charge layer 230 makes it possible to apply a lower electric field but which is sufficient to absorb the photons and release the charge carriers in the Ge-i, then extract these carriers outside of the Ge-i, without however these carriers being sufficiently accelerated to acquire the capacity to ionise the atoms. There is then a strong electric field in the intrinsic Si multiplication region 231 adjacent to the charge layer 230. In this layer the excess noise ratio remains limited, as this is multiplication in the Silicon.

FIGS. 4a and 4b are graphs that respectively show the electric field and the rate of ionisation by impact at the avalanche for various positions in the photodiode according to the prior art shown in FIGS. 3a and 3b.

The curves 41 to 44 each represent the electric field in volts per centimeters ($10^{-2}$ meters) (V/cm) within the photodiode at various positions in the absorption portion 200 along the direction x.

The curve 41 concerns the values to 200 nm ($10^{-9}$ meters) above the core bottom 210, with the bottom being the face of the core 210 opposite the core 110 of the injection guide.

The curve 42 concerns the values to 150 nm above the core bottom 210. The curve 43 concerns the values to 100 nm above the core bottom 210. The curve 44 concerns the values to 50 nm above the core bottom 210.

The curves 45 to 48 each represent the rate of ionisation by impact at the avalanche (number of impacts per second and per cubic centimeters $s^{-1} \cdot cm^{-3}$) within the photodiode at different positions in the absorption portion 200 along the direction x.

The curve 45 concerns the values to 200 nm ($10^{-9}$ meters) above the core bottom 210. The curve 46 concerns the values to 150 nm above the core bottom 210. The curve 47 concerns the values to 100 nm above the core bottom 210. The curve 48 concerns the values to 50 nm above the core bottom 210.

As can be seen in these graphs, it is observed that even if the electric field is low in the Ge-i core 210, the rate of ionisation by impact at the avalanche in the Ge-i core 210 and therefore the random multiplication of the carriers remains substantial. For avalanche photodiodes, the excess noise ratio therefore remains significant despite these structures of the SACM type.

Moreover, these structures of the SACM type are based on a reduction of the extraction speed of the charge carriers in the germanium. This inevitably and detrimentally leads to a reduction in the bandwidth.

It would therefore be very advantageous to propose a solution in order to increase the size of the bandwidth of the avalanche photodiodes without increasing, and even decreasing the excess noise ratio.

However the invention, providing to incline the patterns formed from the absorbent material, makes it possible to ensure that the carriers released by photon absorption, once driven in displacement and accelerated by the electric field, will be accelerated only over a short Ge distance.

Indeed, the carriers are displaced parallel to the direction of the electric field, i.e. perpendicularly to the propagation axis of the light which corresponds to the extension direction "De" of the core of the photodiode. Charge carriers, contrary to photons, therefore pass through only very little Ge since the Ge patterns are inclined and therefore have a low width along the direction of displacement of the charge carriers. The carriers can as such be accelerated more strongly without increasing the excess noise ratio in the Ge, and as such improve the bandwidth. Recall that the excess noise ratio is primarily due to the multiplication in the Ge and clearly less to the multiplication in the sheath, typically made from Silicon.

This reduction in the excess noise is so significant that the charge layer, usually arranged in contact with the Ge core can be suppressed in an avalanche photodiode provided with a structured core such as this invention provides.

Note that these advantages linked to the reduction in the excess noise ratio and to the widening of the bandwidth in relation to SACM structures, is based on the inclination of the patterns of the absorbent material. In order to obtain these advantages, it is not indispensable that the patterns be arranged according to a specific pitch.

According to an embodiment, the invention concerns a photodiode, preferably with a double heterojunction, that comprises at least one absorption portion, with the absorption portion comprising at least one core preferably surrounded at least in part by a sheath that comprises at least two charge extraction regions, with the core comprising:
 a plurality of patterns formed from a first material having the property of generating the displacement of electric charge carriers from photons that are propagating in said first material;
 a confinement layer inside of which the patterns are located, with the confinement layer being formed from a second material that is different from the first and able to be made electrically conductive.

Moreover, the patterns extend primarily according to a direction Dm forming with a direction Dp (x) perpendicular to said main direction De (z) an angle θ such that 90>θ>0 and preferably 80>θ>10.

With this configuration of the patterns, the carriers generated by absorption, once accelerated by the electric field, will be accelerated only over a short distance from the absorbent material, typically germanium. The invention as such allows for a very significant reduction in the excess noise.

It thus makes it possible to retain a substantial electric field in the core and therefore to accelerate the extraction speed of the charge carriers. The bandwidth of an avalanche photodiode according to the invention is therefore more substantial than an avalanche photodiode of the SACM type wherein the electric field in the Ge is reduced.

Moreover this embodiment specific to avalanche photodiodes has the same advantages as those mentioned for the preceding embodiments namely: a reduced absorption portion length, a wider bandwidth and a reduced dark current.

Another object of this invention relates to a microelectronic device comprising at least and preferably a plurality of photodiodes according to one of the embodiments mentioned hereinabove.

The term microelectronic device refers to any type of device carried out with means of microelectronics. These devices encompass in particular in addition to the devices with a purely electronic purpose, micromechanical or electromechanical devices (MEMS, NEMS . . . ) as well as optical or optoelectronic devices (MOEMS . . . ).

BRIEF DESCRIPTION OF THE FIGURES

The purposes and objects, as well as the characteristics and advantages of the invention shall be clearer in the detailed description of an embodiment of the latter which is shown by the following accompanying drawings wherein:

FIG. 7a shows the entire length of the absorption portion. FIG. 7b is an enlargement of FIG. 7a, taken on the interface between the injection guide and the upstream end of the absorption portion.

FIG. 11, comprising

Figure 1:
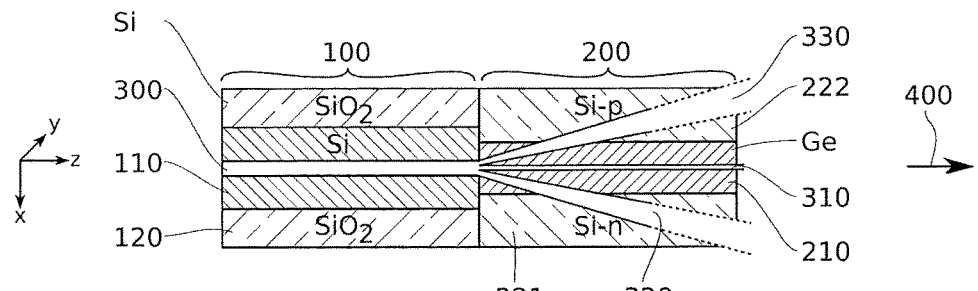
FIG. 1 is a cross-section diagrammatical view of a double heterojunction photodiode Si-p/Ge-i/Si-n according to prior art, wherein a simulation of the propagation of the light waves is shown diagrammatically.

The drawings are provided by way of examples and do not limit the invention. They form diagrammatical block diagrams intended to facilitate the understanding of the invention and are not necessarily to the scale of the practical applications. In particular, the relative thicknesses of the various layers as well as the relative dimensions of the various portions of photodiode and of the patterns do not represent reality.

DETAILED DESCRIPTION OF THE INVENTION

Before beginning a detailed review of embodiments of the invention, optional characteristics are mentioned hereinafter which can possibly be used in a combination or alternatively.

According to an embodiment, the pitch p is sufficiently low so that the propagation of the luminous flux is carried out primarily along the direction De (z) and according to a slow light phenomenon.

According to an embodiment, the pitch p is such that:

$$\leq \frac{\lambda}{4}$$

λ is the wavelength to be detected by the photodiode, preferably the smallest wavelength to be detected by the photodiode.

According to an embodiment, the pitch p is such that:

$$\leq \frac{\lambda}{6} \text{ and preferably} \leq \frac{\lambda}{7}.$$

According to an embodiment, the angle θ is such that 70>θ>5 and preferably 60>θ>10 and preferably 50>θ>15. According to an embodiment, the angle θ is such that 70>θ. According to an embodiment the angle θ is such that θ>10.

According to an embodiment, the patterns are arranged periodically along a main extension direction De (z) of said core by having a pitch p such that:

$$< \frac{\lambda}{2n_{eff}}$$

$n_{eff}$ being the effective refractive index of the mode.

Those skilled in the art know how to determine $n_{eff}$. Conventionally they can for example use a simulation tool in order to determine $n_{eff}$. By way of a non-limiting example, they can use software of the finite element mode solver type (for example the Comsol software developed by the Comsol company).

With this pitch p, the photodiode according to the invention allows for a propagation of the light according to a slow light phenomenon. For a given sensitivity, this makes it possible to further reduce the length of the photodiode and therefore to further increase the bandwidth of the photodiode.

According to an embodiment, $n_{eff}>2$, preferably $n_{eff}>1.8$, preferably $n_{eff}>1.5$.

According to an embodiment, the photodiode is configured in such a way that an incident light to be detected reaches the core along said main direction De (z). It is this incident light that provides the photons intended to be absorbed in the first material.

According to an embodiment, the photodiode is configured in such a way that a light to be detected propagates within the photodiode primarily along said main direction De (z).

According to an embodiment, the photodiode is configured in such a way as to receive an incident light. The main direction of the incident light on the absorption portion is parallel to said main direction De (z) and preferably corresponds to said main direction De (z). As such the incident light arrives on the absorption portion, preferably reaches the core, along the direction De (z), with the main direction De (z) being the direction according to which the patterns are arranged periodically According to an embodiment, the patterns of the core are formed from an intrinsic semiconductor material such as germanium (Ge) and the confinement layer is made from silicon and said extraction regions are made from p- and n-doped silicon (Si).

According to an embodiment, the patterns are arranged periodically along a main extension direction De (z) of said core by having a pitch p such that p≤425 nm ($10^{-9}$ meters), preferably p≤400 nm, preferably p≤330 nm, preferably p≤280 nm, preferably p≤250 nm. With these values, the diffraction in the sheath is substantially reduced and the light is absorbed over a reduced length of absorption portion, the diffraction is even suppressed and a slow light phenomenon is obtained.

According to an embodiment, λ, the wavelength to be detected by the photodiode, preferably the smallest wavelength to be detected by the photodiode is such that λ≤2 μm ($10^{-6}$ meters). Preferably λ≤1.7 μm. Preferably λ≥1.0 μm.

According to an embodiment, 1.0≤λ≤1.7 μm. Preferably 1.0≤λ≤1.55 μm. Preferably 1.1≤λ≤1.55 μm. Preferably 1.31≤λ≤1.7 μm. Preferably 1.31≤λ≤1.55 μm.

According to an embodiment, the photodiode forms an avalanche photodiode.

According to an embodiment, the displacement of electric charge carriers in the core is carried out according to directions parallel to the direction Dp (x) and the height h of the patterns, taken according to the main direction De(z) is such that 3p≥h≥0.5p and preferably 2p≥h≥0.5p and preferably 1.5p≥h≥0.5p and preferably 1.2≥h≥0.8p.

With p≥h; the patterns, projected along the direction De (z), do not overlap and the photodiode is configured in such a way that the displacement of electric charge carriers in the core is carried out according to directions parallel to the direction Dp (x). As such, the charge carriers, by travelling in directions parallel to the direction Dp (x), each encounter only a single pattern during their displacement in the core.

When the photodiode is of the avalanche photodiode type, this makes it possible to significantly reduce the excess noise due to the random multiplications in the absorbent material, for example germanium.

Indeed, with this configuration of the patterns, the carriers released by absorption, once accelerated by the electric field, will be accelerated only over a short distance from the absorbent material.

Charge carriers, contrary to photons, therefore pass through only very little Ge. However the excess noise ratio is substantially due to the multiplication in the Ge and clearly less to the multiplication in the sheath, made from Silicon.

The invention as such allows for a very significant reduction in the excess noise.

According to an embodiment, the height h of the patterns, taken according to the main direction De(z) is substantially equal to the pitch p of the patterns (h=p). The patterns projected along the direction De (z), are therefore juxtaposed. As such, the patterns projected along the direction De (z), do not leave any intermediate space between them. As such, by travelling the directions parallel to the direction Dp (x), one, and preferably a single pattern is inevitably encountered and the quantity of absorbent material is increased for a given photodiode length.

According to an embodiment, $$\theta \leq \tan^{-1}\left(\frac{P}{W_2}\right),$$

$W_2$ being the width of the core or the width taken along the direction Dp (x) wherein the pattern must re-enter and preferably $$\theta \approx \tan^{-1}\left(\frac{P}{W_2}\right).$$

This makes it possible to increase the quantity of absorbent material without extending the length of the absorption portion.

According to an embodiment, the photodiode comprises a multiplication layer configured to favour the multiplication of charge carriers by impact, with the multiplication layer being arranged between one of the extraction regions and the core. Preferably the multiplication layer is made from intrinsic silicon.

According to an embodiment, the multiplication layer is directly in contact with the core and with one of the extraction regions. As such the photodiode does not include a charge layer. This is made possible by the fact that, in relation to known solutions, the invention makes it possible to significantly reduce the excess noise usually caused by the random multiplication of the charge carriers in the germanium.

Alternatively, the photodiode comprises a charge layer arranged between the multiplication layer and the core. As such, the multiplication layer is not in contact with the core. An electric field is applied in the core in such a way that the multiplications are carried out outside of the core or at least substantially outside of the core of the absorption portion. Preferably the charge layer is made from p-doped silicon.

According to an embodiment, the second material forming the confinement layer has as a base the same material as a material forming the charge extraction regions.

Preferably the second material is identical to the material of the charge extraction regions. This makes it possible to simplify the creation of the photodiode.

The confinement layer is electrically conductive or able to be made electrically conductive. It can be made from a conductive or electrically conductive material.

According to an embodiment, the width of the patterns is equal to the width $W_2$ of the core of the absorption portion, with the width of the patterns being measured as a projection along the direction Dp (x) and taken from one end to the other of the pattern.

The patterns have flanks, preferably substantially parallel, which extend mainly along the direction Dm.

According to an embodiment, the core of the absorption portion has a width $W_2$ measured as a projection along the direction Dp (x). The patterns have flanks substantially parallel to said direction Dm. The patterns have a dimension $W_{21}$ taken, from one flank to the other and along the direction Dp (x) perpendicular to said main direction De (z), with $W_{21} \leq W_2/k$, and with $k \geq 1.5$, preferably $k \geq 2$, preferably $k \geq 3$, preferably $k \geq 4$.

According to an embodiment, the patterns have flanks substantially parallel to said direction Dm. The patterns have a dimension $W_{21}$ taken, from one flank to the other and along the direction Dp (x) perpendicular to said main direction De (z), with $W_{21} \leq p/m$, and with $m \geq 1$, preferably $m \geq 1.5$.

According to an embodiment, $W_2 \geq p$.

Also optionally, the invention can have at least any one of the following claims that can be taken in combination or alternatively.

According to an embodiment, at least one among the sheath of the injection guide and the sheath of the absorption portion comprises air, a gas or a vacuum.

According to an embodiment, the difference between the refractive indexes of the core and of the sheath of the injection guide is greater than the difference between the refractive indexes of the core and of the sheath of the absorption portion. This makes it possible to better confine the light in the core by preventing the diffusion thereof in the sheath of the absorption guide.

According to an embodiment, the photodiode is of the Si-n/Ge-i/Si-p type.

According to an embodiment, at least one and preferably both among the core of the injection guide and the core of the absorption portion has, in a section according to a plane xy parallel to said transverse plane zx, a surface area less than 100 µm$^2$, preferably less than 10 µm$^2$, and preferably less than 1 µm$^2$. Typically the diameter, if the section of the core is circular, or the largest side if the section of the core is a polygon, is less than 50 µm, preferably less than 10 µm and preferably less than 1 µm.

According to an embodiment, the cores of the first and second guides are in direct contact. That is to say that there is no element, vacuum or air between them.

According to an embodiment, the first and second cores form a coupling interface, said interface being flat. According to an embodiment, the interface is contained in a plane (xy) parallel to said transverse plane (zx).

According to an embodiment, the photodiode comprises an injection guide comprising a core and a sheath, the core of the injection guide being configured to provide light waves to the core of the absorption portion.

It is specified in the framework of this invention, that the term "on", "overmounts", "covers" or "underlying" or the equivalents thereof do not necessarily mean "in contact with". As such for example, the deposition of a first layer on a second layer, does not necessarily mean that the two layers are directly in contact with one another but this means that the first layer covers at least partially the second layer by being either directly in contact with it or by being separated from it by at least one other layer or at least one other element.

Conventionally, a doping noted as p means that it is a doping with positive charges and an n doping means that it is a doping with negative charges.

Note that in the rest of the description the bandwidth of the photodiode is expressed in Hz or Giga Hz and characterises its reaction rapidity, not the range of wavelengths that it can detect.

An example of a photodiode according to the invention shall now be described in reference to FIGS. 5a and 5b.

The photodiode according to the invention comprises at least one first waveguide forming an injection guide 100 and a second waveguide forming the charge absorption and extraction portion 200. Each waveguide comprises a core 110, 210 and a sheath 120, 220. The light penetrates into the injection guide 100 to then reach the core 210 of the absorption and extraction portion 200.

The core 210 comprises a material that has the property of absorbing photons with as a consequence to release the electric charge carriers that it contains. These are generally referred to as gap materials. Under the effect of an electric field, these charge carriers that have been released are then set into motion in order to be collected and extracted on the extraction regions 221, 222 of the sheath 220. Electrodes 250, 251 on extraction regions 221, 222 are also provided.

Generally, the extraction regions 221, 222 are made from an electrically conductive material or able to be made conductive. This is most often a semiconductor material such as p- and n-doped silicon (Si) for respectively extraction regions 221, 222. The sheath 220 can further comprise an additional layer 223 that covers the core 210, and the extraction regions 221, 222, as is the case for the photodiode shown in FIG. 2a. This encapsulation layer is preferably formed from a dielectric such as SiO$_2$.

Figure 5A:
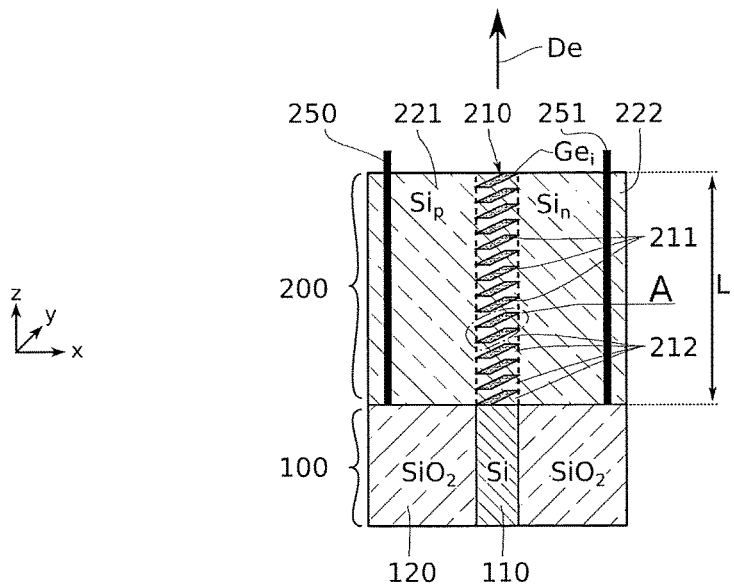
FIG. 5a is a longitudinal section view (zx) that diagrammatically shows a photodiode according to a first non-limiting embodiment of this invention.

As shown in FIG. 5a, the cores 110, 210 of the guides 100, 200 have sections, taken according to a section xy which remains substantially constant along the axis z.

The coordinate system x, y, z is indicated in FIG. 5a. The z axis corresponds to a main extension direction De of the core 110, 210 of the guides 100, 200. It is parallel to this main direction De that the luminous flux propagates primarily in the guides 100, 200.

In the example shown, and without this being limiting, the core 110 of the injection guide 100 is made from Si, its sheath 120 is made from SiO$_2$, the patterns 211 of the core 210 of the absorption guide 200 are made of Ge-i and its confinement layer 212 of Si. The sheath 220 of the absorption guide 200 is formed from an n-doped Si (Si-n) region 221 and from a p-doped Si (Si-p) region 222.

As such, the patterns 211 of the core are made from germanium and are surrounded by silicon. This type of photodiode therefore defines, for each pattern 211, two Si/Ge interfaces, for example by travelling the direction Dp (x), which corresponds substantially to the direction of displacement of the electric charge carriers. This appears clearly in FIGS. 5a and 6a. This photodiode therefore defines, for each pattern 211, two heterojunctions. It can as such be qualified as a double heterojunction photodiode.

Recall that in literature a double heterojunction photodiode qualifies a photodiode of which the core defines a first and a second Si/Ge junctions.

Advantageously, for each waveguide, the refractive index of the core is greater than the refractive index of its sheath so as to confine the light ray in the cores 110, 210 by preventing a diffusion within the sheaths 120, 220. Note that those skilled in the art know how to calculate the refractive index of a sheath if the latter is heterogeneous at the surface of the core.

Those skilled in the art also know how to calculate the refractive index of the heterogeneous core 210.

Note that the effect of the patterns 211 on the beam is primarily contained along the x axis. As such the portion of sheath 220 that is to be taken into account in terms of the refractive indexes is primarily the lateral sheath, formed in this non-limiting example by the regions 221, 222 and where applicable 230, 231.

Advantageously, the core 210 of the absorption guide 200 comprises a plurality of patterns 211 formed from absorbent material.

As such, the latter is not distributed homogeneously over the entire length L of the absorption portion of the photodiode. It is distributed in a one-off manner. The patterns 211 as such form inclusions.

The core 210 also comprises a confinement layer 212 inside of which the patterns 211 form inclusions. The confinement layer 212 is made from a material that can be made electrically conductive such as a semiconductor material or a conductive material.

The patterns 211 are distributed along the direction De (z) with a pitch p which contributes in generating multiples reflections for the photons by limiting the diffraction in the sheath 210. These multiple reflections generate a slowing down phenomenon of the light which makes more photons absorbed over a given length. In relation to photodiodes according to prior art, it is as such possible to reduce the length of the absorption guide 200 for a given sensitivity.

According to an advantageous embodiment, the pitch p of the patterns 211 is such that:

$$\leq \frac{\lambda}{4} \quad (1)$$

$\lambda$ being the shortest wavelength that the photodiode is supposed to detect.

For an application in telecommunications, $\lambda$ is for example between 0.8×1.55 μm and 1.2×1.55 μm and preferably equal to 1.55 μm.

Preferably, $$\leq \frac{\lambda}{6} \text{ and preferably} \leq \frac{\lambda}{7}.$$

With the condition (1), the diffraction of the light in the sheath 220 is reduced, even suppressed, and the absorption in the core 210 over a given distance is improved.

According to an even more advantageous embodiment, the pitch p of the segmentation is such that:

$$\leq \frac{\lambda}{2n_{eff}} \quad (2)$$

$_{eff}$ is the effective index of the mode. This index is determined by methods and tools that are well known to those skilled in the art. For example, they can use software of the finite element mode solver type (for example the Comsol software developed by the Comsol company).

Preferably $n_{eff}$>2. Preferably $n_{eff}$>1.8 and preferably $n_{eff}$>1.5.

For a photodiode of which the patterns 211 are made of intrinsic Germanium (Ge-i), the confinement layer 212 is for example made from silicon and the extraction regions 221, 222 are made from Si-p and Si-n, the equation (2) reverts to:

$$< \frac{\lambda}{7}.$$

With $\lambda$=1.55 μm, the pitch p must then be less than 200 nm.

If the condition (2) is satisfied, a slow light phenomenon is obtained, with the light slowing down in the core 210 in order to be absorbed therein over a short distance, this without or with very little diffraction in the sheath. With the condition (2), the light propagates in the structured and homogenous core by locally accomplishing multiple reflections but by advancing globally as in a homogeneous medium.

With the condition (2), a reduction in losses through roughness is obtained due to a delocalisation of the mode by a reduction in the effective index.

The condition (2) therefore makes it possible to reduce even more the length of the core 210 for a given photodiode sensitivity. The bandwidth is therefore increased without degrading sensitivity.

Advantageously, p≤425 nm ($10^{-9}$ meters), preferably p≤400 nm, preferably p≤330 nm, preferably p≤280 nm, preferably p≤250 nm.

This pitch p allows for particularly good performance in the field of telecommunications where the wavelengths are generally less than 2 μm and preferably less than 1.7 μm and with photodiodes of which the core 110 of the injection guide 100 has a germanium base and of which the core 210 of the absorption portion 200 has a germanium base.

The diffraction in the sheath is substantially reduced and the light is absorbed over a reduced length of absorption portion, and even the diffraction is suppressed and a slow light phenomenon is obtained.

Figure 5B:
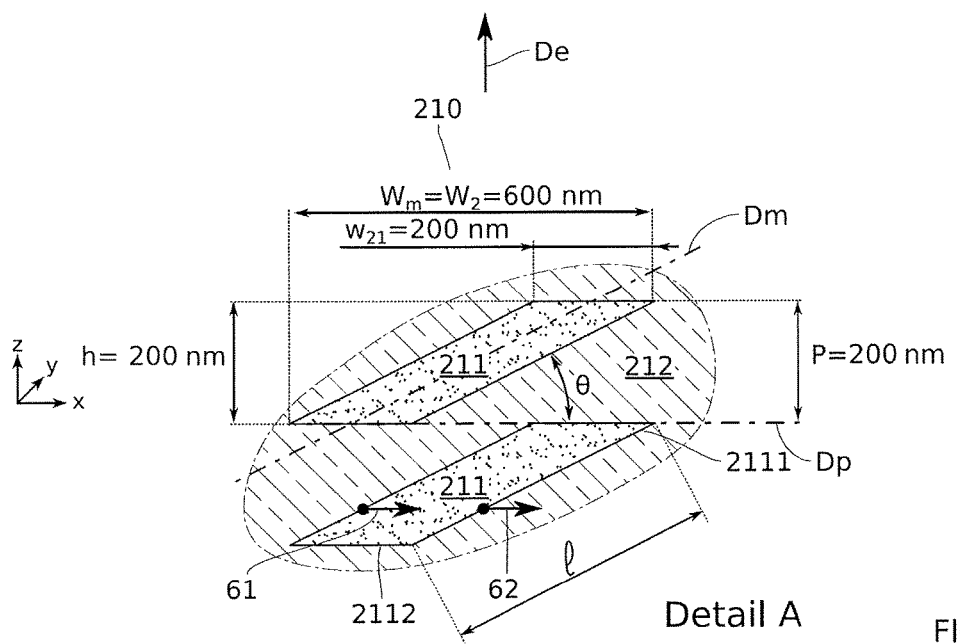
FIG. 5b is an enlarged view of FIG. 5a, centred on two of the patterns of the absorbent material.

FIG. 5b shows two enlarged patterns. In this figure are shown:

- the main extension direction De of the core 210 which is parallel to the z axis;
- the direction Dm corresponding to the main direction according to which the patterns 211 extend.
- the direction Dp perpendicular to the direction De and parallel to the x axis.
- the pitch p: this pitch p is measured along the direction De (z), for example from one upper end of a pattern 211 to the upper end of the pattern 211 that is adjacent to it.
- the length L of the absorption guide 200. This length, taken along the direction De (z) is preferably substantially equal to the length of the core 210.
- the width $W_m$ of the pattern 211: this width $W_m$ is taken along the direction Dp (x) from one end to the other of the pattern 211.

In a non-limiting but preferred manner, the width $W_m$ of the pattern corresponds to the width $W_2$ of the core 210.

- the height h of the pattern 211: this height h is taken along the direction De (z) and measured from one end 2112 to the other 2112 of the pattern 211.
- the length l of the pattern 211: this length l being taken along the direction Dm and measured from one end 2112 to the other 2112 of the pattern 211 along this direction.

In the non-limiting example of FIG. 5a, as the pattern 211 is a parallelogram, it has parallel flanks 2111 oriented along the direction Dm and which correspond to its length l. These flanks 2111 join the two ends 2112 of the pattern 211.

As shown in FIGS. 5a and 5b the patterns 211 are inclined. They extend along the main direction Dm that forms with the direction Dp an angle θ with θ>0, preferably, θ<90.

The inclination of the patterns has several advantages.

It makes it possible, for a given core 210 width $W_2$, to create patterns 211 of which the length l is more substantial. This makes it possible to release the manufacturing constraints for this dimension, which is particularly advantageous when the core 210 is very thin (low dimension according to Dp (x)).

Figure 3A:
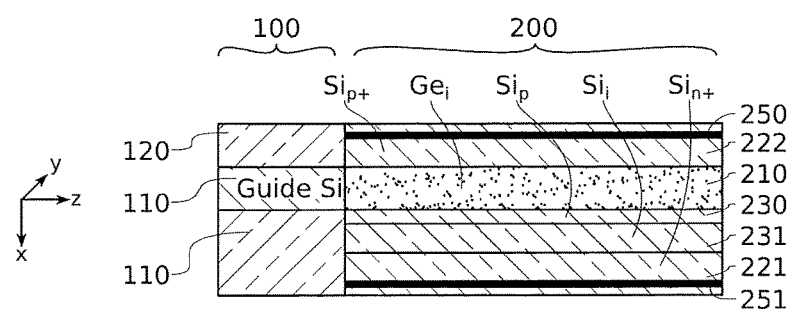
FIGS. 3a and 3b are cross-section views, respectively according to a longitudinal section (zx) and according to a transverse section (xy), of an avalanche photodiode according to prior art.
Figure 3B:
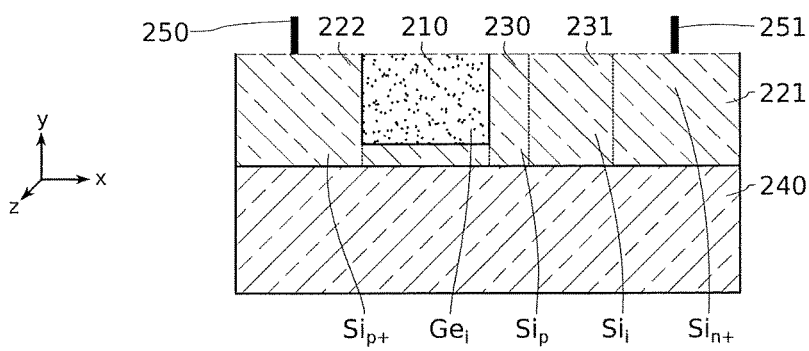
Figure 4A:
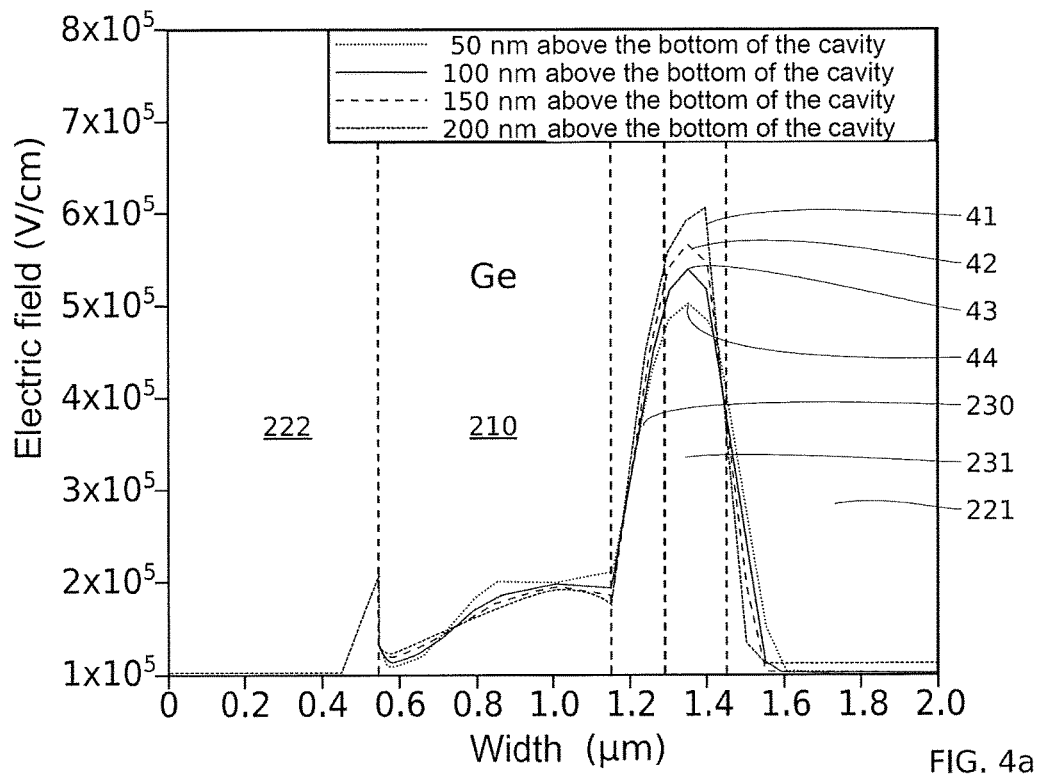
FIGS. 4a and 4b are graphs that respectively show the electric field and the rate of ionisation by impact at the avalanche for various positions in the avalanche photodiode shown in FIGS. 3a and 3b.
Figure 4B:
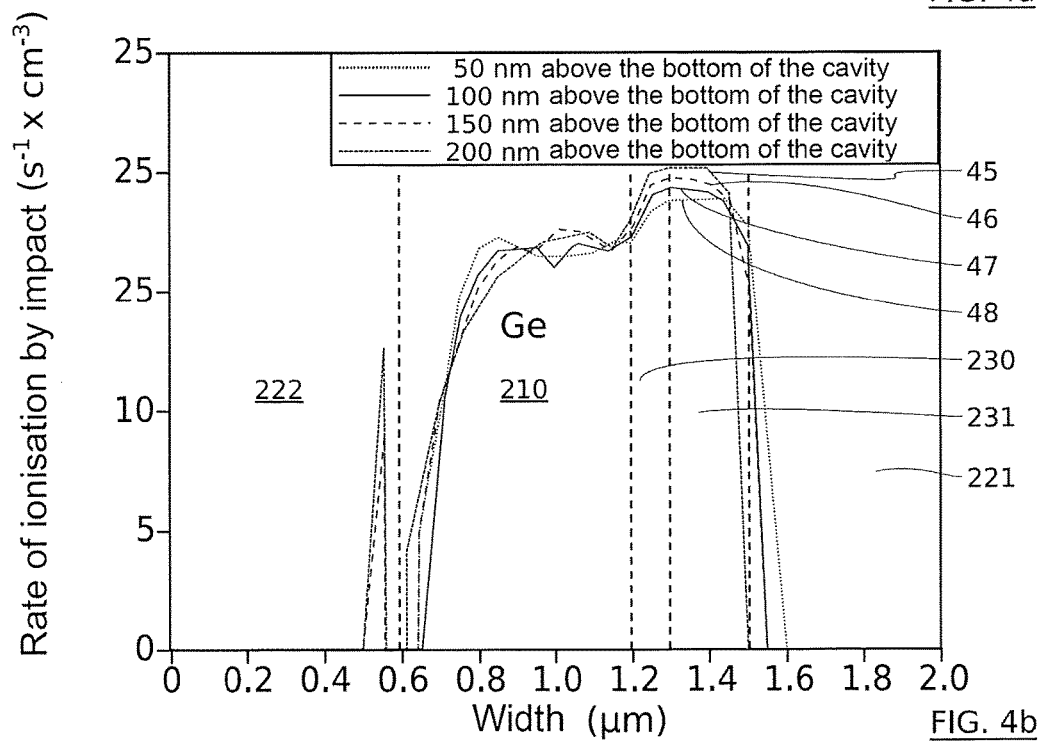
Figure 6A:
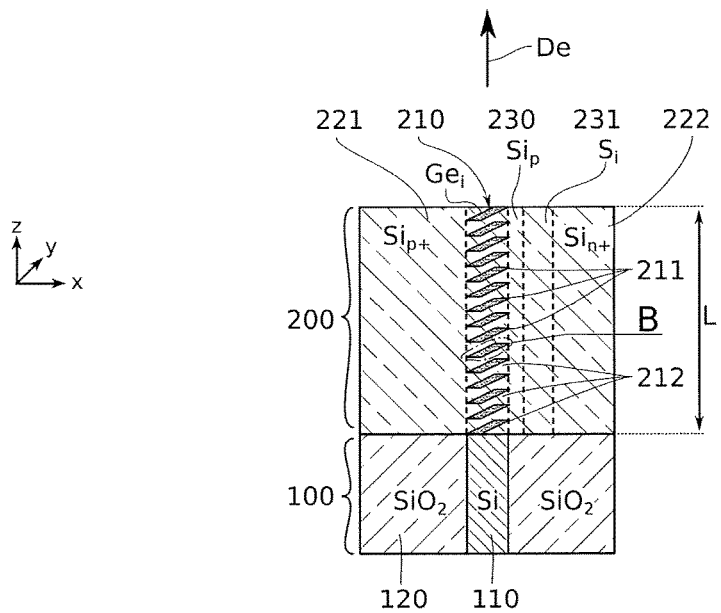
FIG. 6a is a longitudinal section view (zx) diagrammatically showing a photodiode according to a second non-limiting embodiment of this invention, in this second embodiment, the photodiode is of the avalanche photodiode type.

Moreover, the inclination of the patterns 211 provides a substantial advantage when the photodiode must be the seat of multiplication of carriers created in the absorbent material, such as is the case in avalanche photodiodes, such as those shown in FIG. 6a and wherein there are the elements of FIG. 3a by adding the segmented core 210 thereto.

More precisely and as explained in the "Summary" section, the inclination of the patterns 211 of the structured core makes it possible to limit the distance traveled by the charge carriers in the absorbent material, typically germanium. Indeed, the carriers are displaced along the direction Dp (x) perpendicular to the direction De (z) of the photons.

Figure 6B:
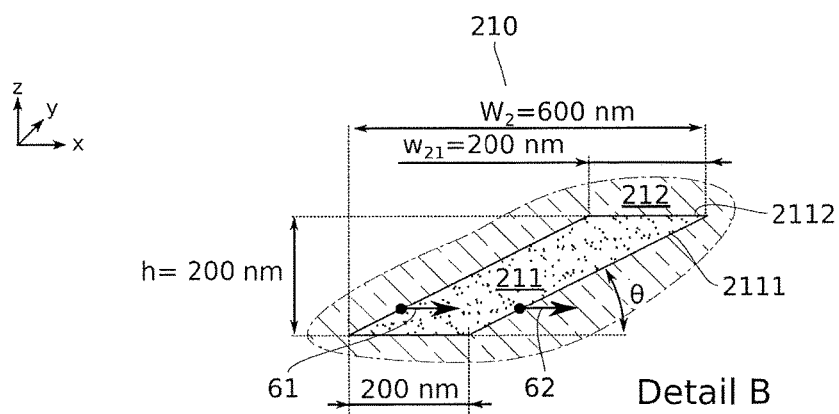
FIG. 6b is an enlarged view of FIG. 6a, centred on one of the patterns of the absorbent material.

They therefore pass through at most a distance $W_{21}$ of absorbent material (as shown by the reference 61 in FIG. 6b) and at least only a few nanometers, even less, of this material as shown by the reference 62 in FIG. 6b).

As shown in FIGS. 6a, 6b, the charge carriers pass through au maximum a distance $W_{21}$ of absorbent material, i.e. in this example 200 nm, although the width $W_2$ of the core 210 is 600 μm. On the other hand the distance traveled by the photons is greater since the latter can possibly pass through several patterns 211 along the direction De (z).

As such, the carriers that have been released by absorption are only accelerated over a short distance in the absorbent material. However, it is in this material that the multiplication is carried out particularly randomly, generating an excess noise that is not possible to calibrate.

The invention as such makes it possible to reduce the excess noise.

According to a first approach, it is therefore possible to significantly increase the electric field in the absorbent material since few multiplications will be carried out. The transit time of the charge carriers can therefore be reduced which improves the bandwidth.

A polarisation voltage can be found so that the carriers are multiplied only in the multiplication layer 231 and as soon as they cross the interface between absorbent material and multiplication material (typically the Ge/Si interface) and this without using the charge layer 230 such as that shown in FIGS. 6a and 12.

According to another approach, if on the contrary a charge layer 230 is used as shown in FIG. 6a, the latter makes it possible to better control the electric field in the inclusions of the absorbent material. It is then possible to increase the polarisation voltage and therefore the gain, while still strongly limiting the excess noise, if care is taken not to exceed the multiplication threshold in the absorbent material.

According to an embodiment, the height h of the pattern 211 is less than or equal to the pitch p.

If h<p, then in projection over the direction De (z), two adjacent patterns 211 are separated by material forming the confinement layer 212 by a distance d. This configuration is shown by the patterns 211 as solid lines in FIG. 11e which shall be described in what follows.

If h=p, then in projection over the direction De (z), two adjacent patterns are end-to-end (d=0).

This embodiment has for advantage to reduce the length L of the photodiode by increasing the quantity of absorbent material that the photons can pass through.

The angle θ formed by the inclination direction Dm of the pattern 211 and by the transverse direction Dp preferably satisfies the following condition:

$$\theta \leq \tan^{-1}\left(\frac{P}{w_2}\right)$$

$W_2$ being the width of the core 210 taken along the direction Dp (x), or the width, along the direction Dp (x), wherein the pattern 211 must be contained. Preferably:

$$\theta \approx \tan^{-1}\left(\frac{P}{w_2}\right)$$

With this condition, for a given width $W_2$ of the core 210 and a given pitch p, it is as such possible to increase the dimension l of the pattern 211, i.e. its dimension along the direction Dm.

With the following dimensions $W_2$=600 μm and p=200 μm, then ≤18° and preferably ≈18°.

This condition as such defines the maximum length l of the pattern 211.

Figure 11A:
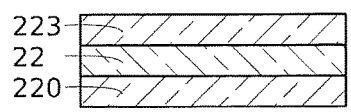
FIGS. 11a to 11g, shows the main steps of an example of a method for producing a photodiode according to the invention.
Figure 11A:
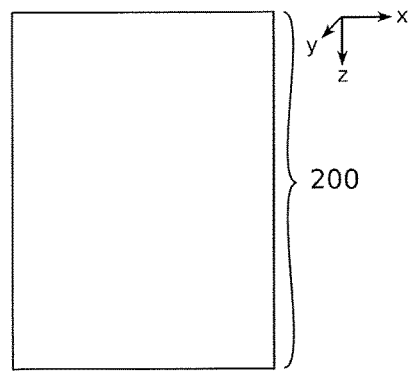
Figure 11B:
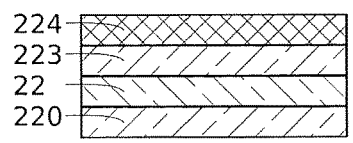
Figure 11B:
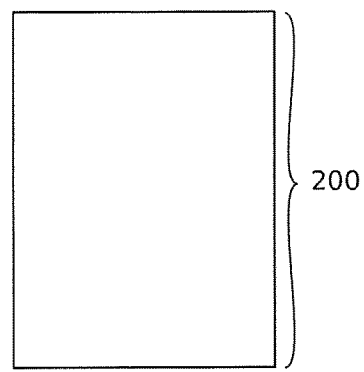
Figure 11C:
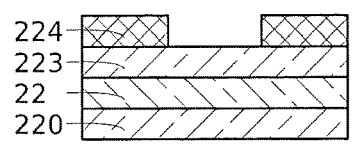
Figure 11C:
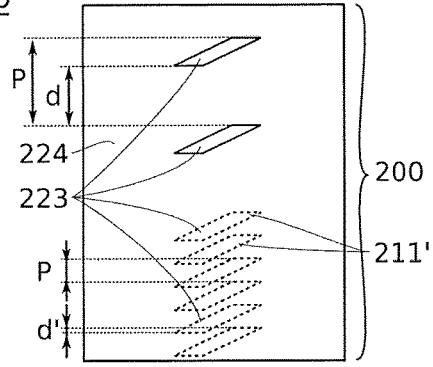
Figure 11D:
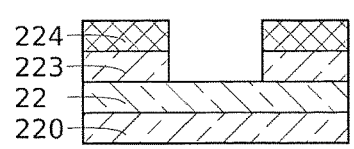
Figure 11D:
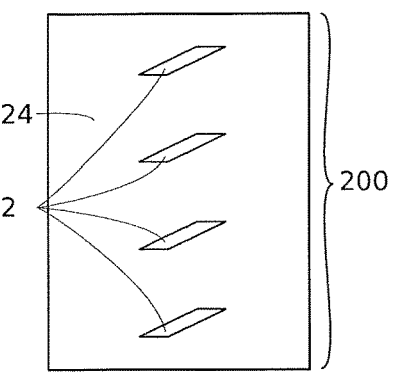
Figure 11E:
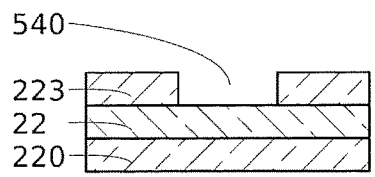
Figure 11E:
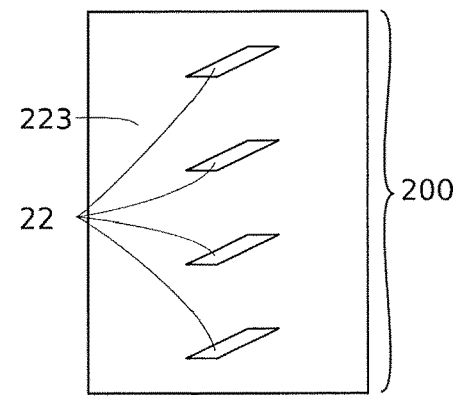
Figure 11F:
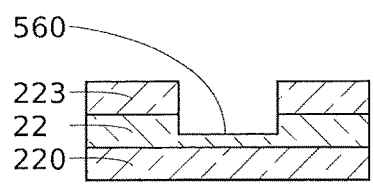
Figure 11F:
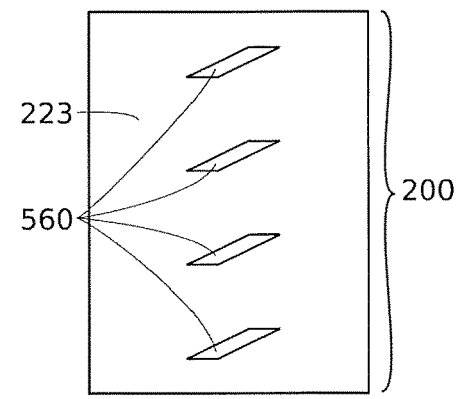

According to another embodiment shown in FIG. 11e by the patterns 211' as a dotted line, the projection over the direction De (z) of the patterns 211, 211' overlaps. As such, the distance d' is "negative".

This embodiment has the advantage of increasing the density the patterns 211 for a given length L of the core 210 and therefore of increasing the quantity of absorbent material.

On the other hand, certain charge carriers will pass through two patterns 211 along the direction Dp(x) which is not optimal for the avalanche photodiodes for the reasons mentioned hereinabove concerning the reduction in the excess noise ratio.

Figure 2A:
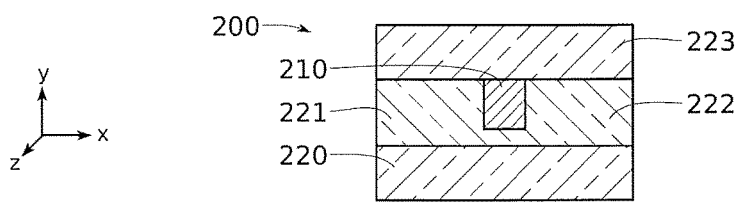
FIGS. 2a and 2b are views of a double heterojunction photodiode close to that of FIG. 1, according to transverse sections (xy) taken respectively on the absorption portion and the injection guide.
Figure 2B:
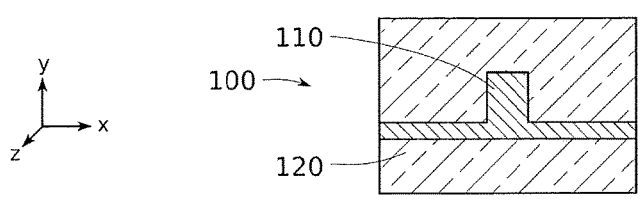
Figure 2C:
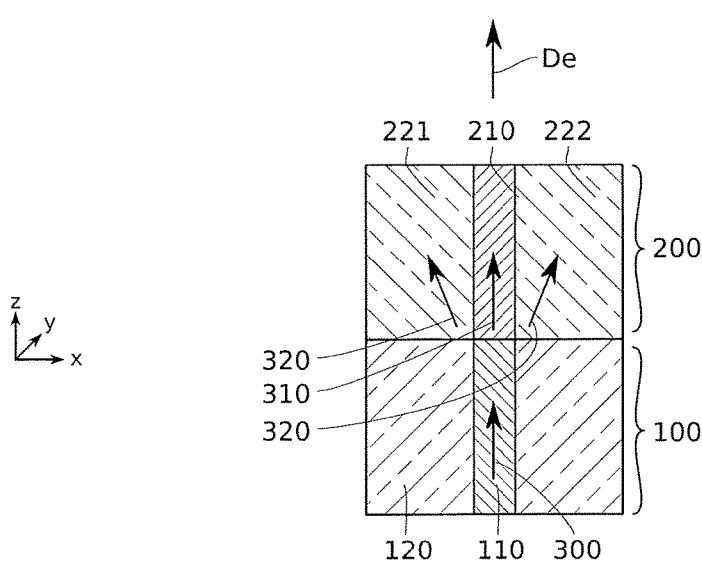
FIG. 2c is a diagrammatical view of the photodiode of FIGS. 2a and 2b according to a longitudinal section (zx), i.e. parallel to the main direction of propagation of the light waves.

In reference to FIGS. 7a to 9b, the performance of an example of a photodiode according to the example embodiment shown in FIGS. 5a, 5b shall be compared to the performance of a conventional photodiode such as shown in FIGS. 2a to 2c.

In these simulations:
λ=1.55 μm
$W_2$=600 nm (Width of the core 210 for the conventional photodiodes and according to the invention)
p=200 nm
$N_{21}$=200 nm
θ=18°
The materials are those shown in FIGS. 5a and 6a.
Injection Guide 100
core 110: Si
sheath 120: SiO$_2$
Absorption Guide 200
extraction regions 221, 222: Si-p and Si-n
core 210: Ge-i for the conventional photodiode
Pattern 211' made from Ge-i and confinement layer 212 made from Si for the photodiode according to the invention.

Figure 7A:
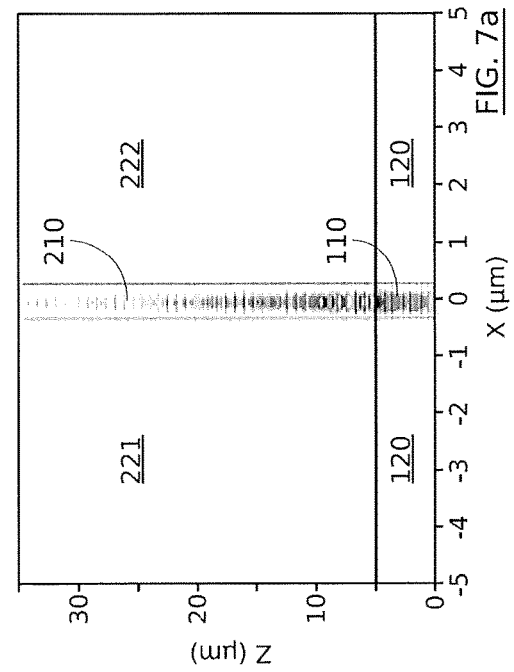
FIGS. 7a and 7b are simulations according to the finite-difference time-domain method (FDTD) of the diffusion of the light in the core of the absorption portion, for a photodiode according to prior art.
Figure 8A:
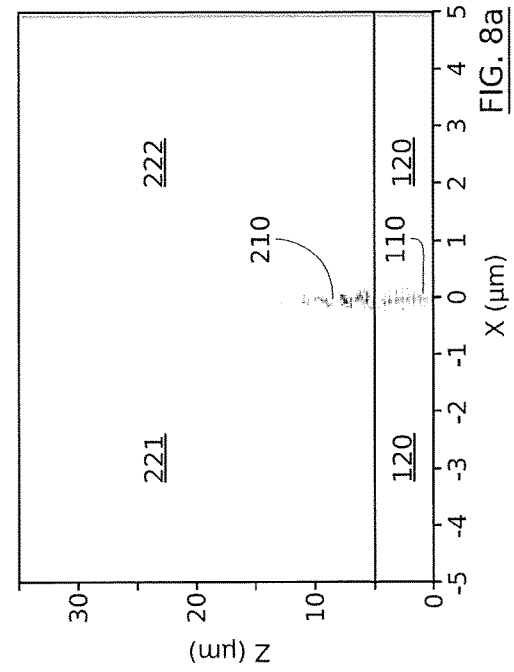
FIGS. 8a and 8b are simulations identical to those of FIGS. 7a and 7b respectively, for a photodiode according to an example embodiment of this invention.

FIGS. 7a and 8a are simulations, obtained according to the FDTD method, of the absorption along the direction De(z) viewed in the cross-section plane (zx) for respectively a conventional photodiode and the photodiode of FIG. 5a.

Figure 7B:
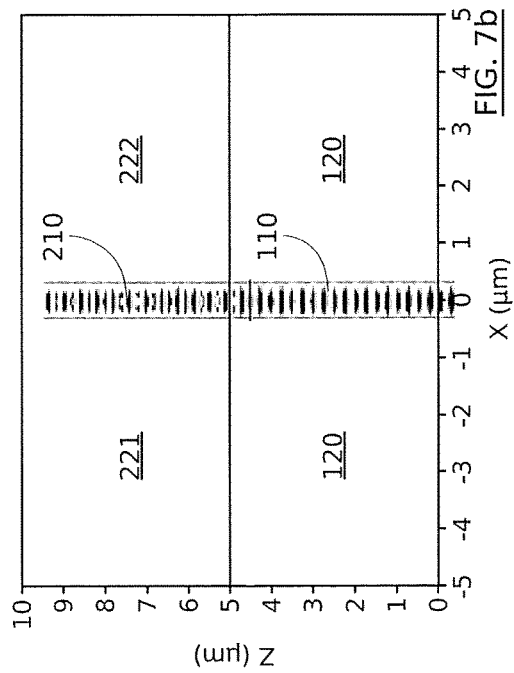
Figure 8B:
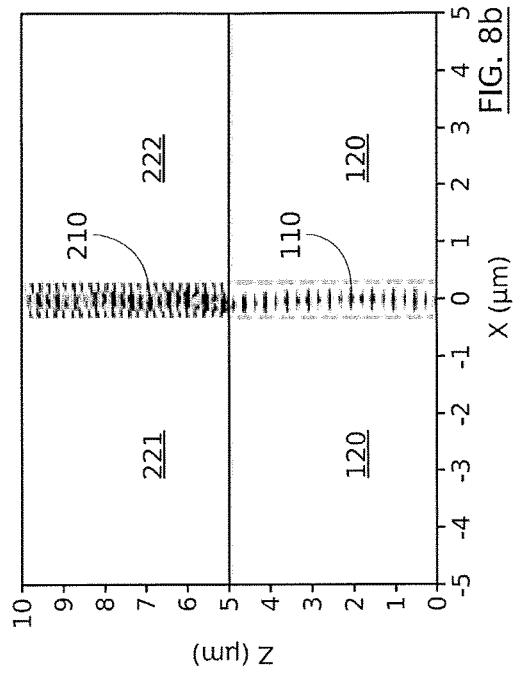

FIGS. 7b and 8b are enlarged views on the interface between the injection guide 100 and the absorption guide 200.

In the FIGS. 7a and 7b, it is observed that with the standard photodiode, the absorption is carried in an exponentially decreasing way, such as provided by the Lambert-Beer Law. Over 35 μm along the direction De(z) (see upper end of FIG. 7b), not all of the light is absorbed.

In FIGS. 8a, 8b, it is observed that all of the light is absorbed over a distance of 15 μm along the direction De(z).

It is as such clearly seen that the photodiode according to the invention makes it possible to substantially reduce the length L of the core 210 for a given sensitivity.

Figure 9A:
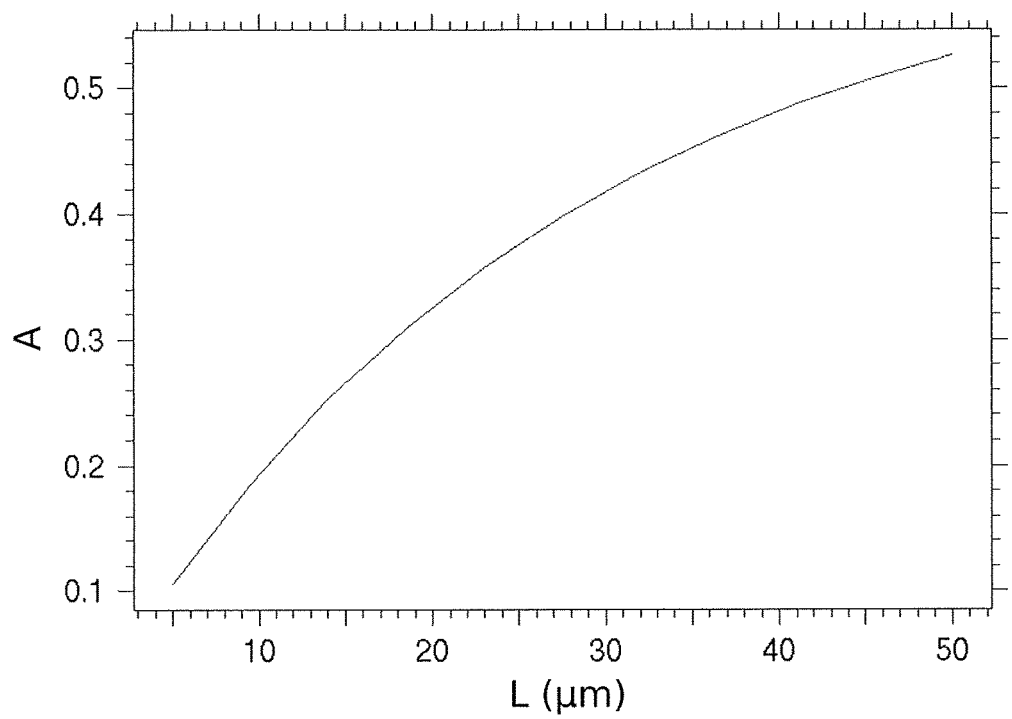
FIGS. 9a and 9b show the change in the absorption of the photodiode according to the length (along the z axis) of the absorption portion for respectively a photodiode according to prior art and a photodiode according to an embodiment of this invention.
Figure 9B:
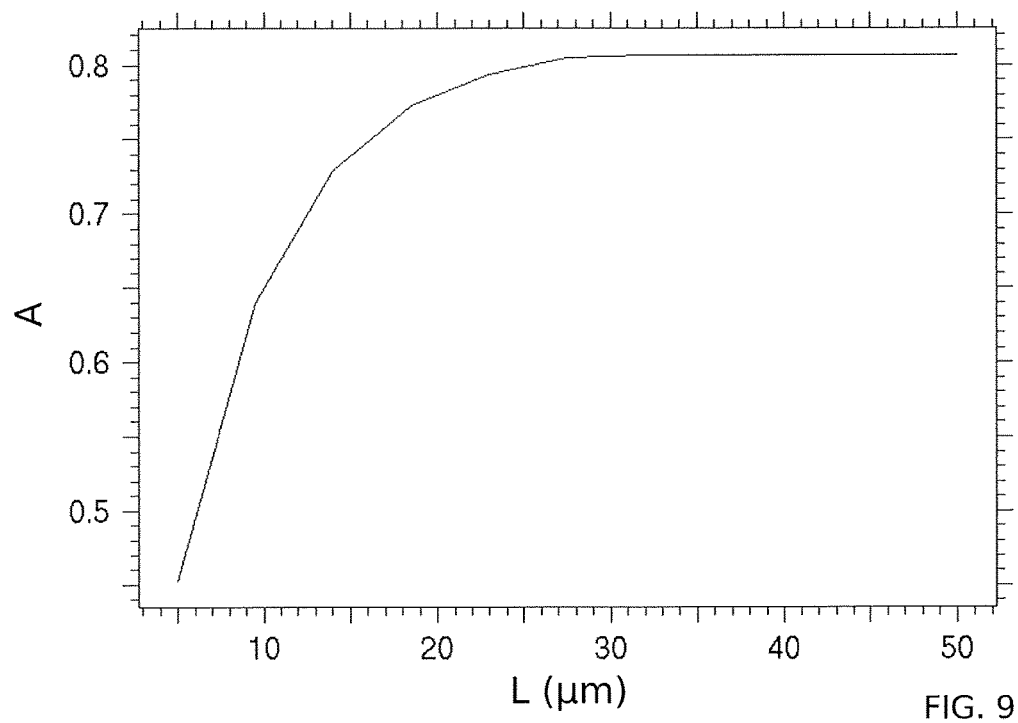

This improved performance is also seen in FIGS. 9a and 9b which show the change in the absorption of the light according to the length L of the core 210 for respectively a conventional photodiode and that of this invention.

It is observed that a conventional photodiode absorbed only 50% of the light over 50 μm while the photodiode according to the invention reaches 50% of absorption over only 7 μm in length. This photodiode according to the invention is therefore seven times more absorbent although it contains three times less absorbent material (here, germanium).

The bandwidth is as such increased. The dark noise is reduced. Moreover, if the photodiode is with an avalanche, such as for example shown in FIGS. 6a, 6b, the multiplication noise is reduced.

The principles of the invention have been described hereinabove and those skilled in the art easily understand that alternatives can be considered without leaving the scope of the claims.

Figure 10A:
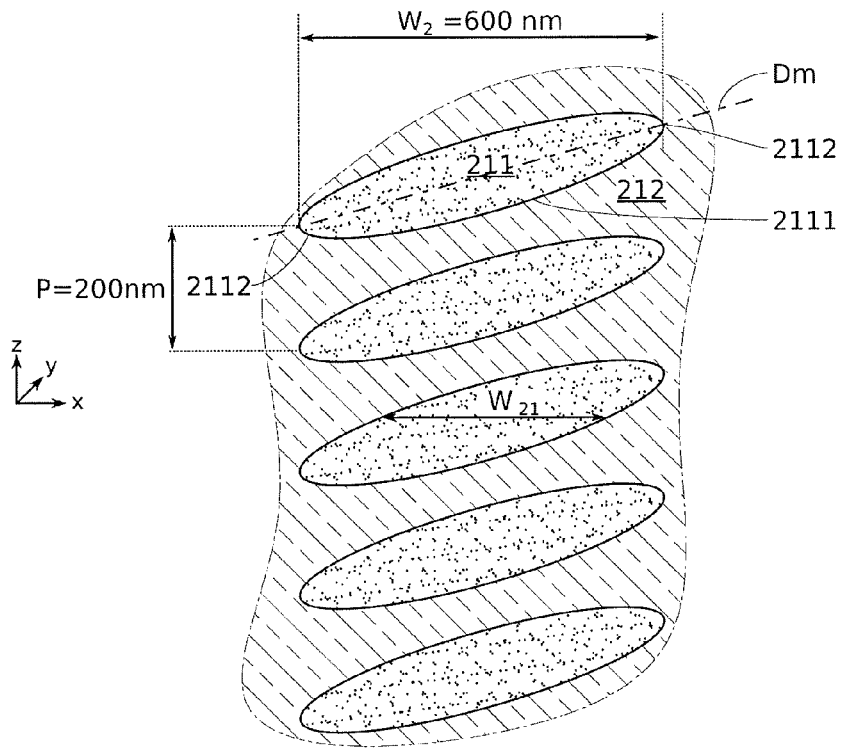
FIGS. 10a and 10b show alternative example embodiments to the one of FIGS. 5a to 6b.
Figure 10B:
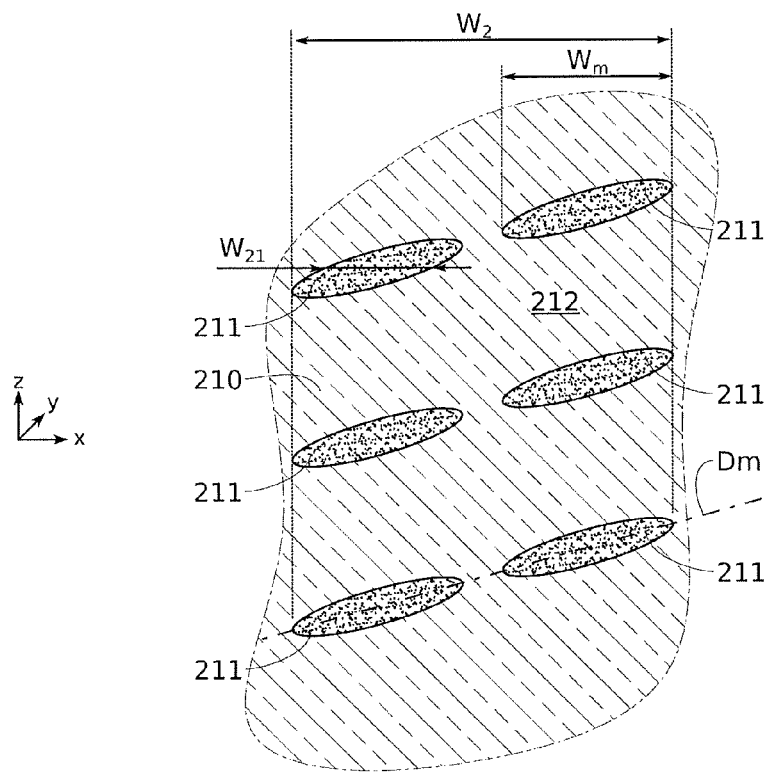

Two alternatives are for example proposed in FIGS. 10a and 10b.

In FIG. 10a, the patterns 211 are formed not by parallelograms as in the embodiments of FIGS. 5a to 6b, but having rounded edges. This shape with rounded edges makes it possible to facilitate the creating of the patterns 211.

In FIG. 10a, this rounding of the edges is amplified and the patterns 211 can form ellipses or oblong shapes. It is however possible to identify a main extension direction Dm and flanks 2111 extending primarily in this direction.

FIG. 10b shows an embodiment wherein several patterns 211 extend along the same direction Dm. The width Wm of a pattern 211 is therefore less than the width $W_2$ of the core 210.

The invention is not limited to particular materials for the core and the sheath of the guides 100, 200.

It is as such possible to have for the core 110 silicon (Si) or Silicon nitride (SiN), and for the sheath 120 silicon dioxide (SiO$_2$), silicon or even a gas such as air for example or a vacuum.

It is possible to have for the absorbent material of the core 210 germanium preferably intrinsic (Ge-i) and for the confinement layer 212 silicon. It is possible to have for the sheath 220 silicon, preferably doped, silicon dioxide (SiO$_2$), or even a gas such as air for example or a vacuum.

An example of the method for manufacturing a photodiode shown in FIGS. 5a to 6b shall now be described in reference to FIGS. 11a to 11g. Each one of the FIGS. 11a to 11g comprises a cross-section view of the absorption portion 200 (viewed according to a plane xy) and a top view (view parallel to the plane zx).

The first step (FIG. 11a) consists in providing a stack of layers comprising in particular:
a substrate 220, for example a dielectric material such as SiO$_2$;
a layer 22 overmounting the substrate 220 and intended to form at least a portion of the sheath 220 for the core 210. This layer 22 is preferably, but not limitatively, made of a semiconductor material such as silicon.

According to an embodiment, this layer 22 has at least two doped regions located on either side of the y axis. As such, one region located for example to the left of the y axis is n-doped and another region located to the right of the y axis is p-doped. These regions are intended to form the charge extraction regions 221, 222. Furthermore, if the photodiode is with an avalanche, by absence of doping and by doping, respectively the multiplication layer 231 will be formed and where applicable the charge layer 230 as described in reference to FIGS. 6a and 6b.

a layer 223, for example made of a dielectric material such as SiO₂, is intended to form a hard mask.

The steps shown in FIGS. 11b to 11d aim to etch the hard mask 223 in order to give it the structuring of the core 210 of the absorption portion 200. This structuring appears in FIGS. 11c and 11d. A plurality of patterns 211 can as such be seen here mutually separated by a distance d or d'. As indicated hereinabove and shown in FIG. 11c, for certain embodiments d can be zero or positive and for other embodiments d' can be negative as shown by the patterns 211' as a dotted line.

In order to form patterns 211 for example, a deposition is made of a layer of resin 224 (FIG. 11b) that is worked (FIG. 11c) by any suitable means of lithography (photolithography, electron beam lithography, nano-printing, etc.) in order to give the openings the desired segmentation for the core 210 of the absorption guide 200.

In the examples of FIGS. 11a to 11d the patterns form parallelograms. In practice, it will be easier if the patterns have rounded edges as described in reference to FIG. 10a.

As shown in FIG. 11d, the hard mask 223 is then etched through the mask formed by the open layer of resin 224. Then the layer of resin 224 (FIG. 11e) is removed. The layer 22 intended to partially form the sheath 220 is then etched through the hard mask 223.

Figure 11G:
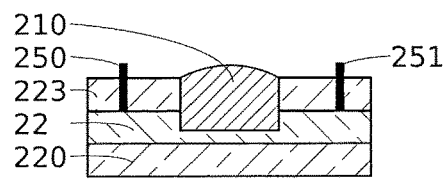
Figure 11G:
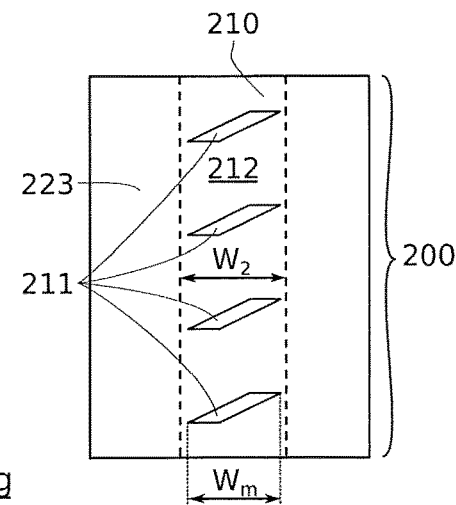

A filling is then carried out of the cavity 540 formed as such by the material forming the core 210 of the absorption portion of waves 200 (FIG. 11g). The core 210 then has the desired structuring.

According to an embodiment, in order to fill the core 210, epitaxial growth is carried out using a residual layer 560 of the layer 22 left in place at the end of etching.

As such according to this embodiment the etching of the layer 22 is only partial and leaves a thickness 560 in the bottom of the opening 540.

For example, if the material of the layer 22 is crystalline or polycrystalline silicon, it is possible to fill the cavity by causing the germanium to grow via epitaxy.

If the patterns have reduced dimensions, those skilled in the art can use the many techniques that they know. Moreover, reference can be made to the following publication, in particular in section 2, so as to facilitate the filling of the cavity 560 by an absorbent material such as germanium: "Zero-bias 40 Gbit/s germanium waveguide photodetector on silicon" of which the authors are Laurent Vivien, Andreas Polzer, Delphine Marris-Morini, Johann Osmond, Jean Michel Hartmann, Paul Crozat, Eric Cassan, Christophe Kopp, Horst Zimmermann, Jean Marc Fédéli. This publication was published in the review OPTICS EXPRESS 1096, Vol. 20, on 16 Jan. 2012.

Preferably, a step of flattening is then carried out, for example via chemical-mechanical polishing (CMP) so that the upper faces of the layer 22 and of the core 210 are substantially included in the same plane.

Then it is possible to cover the upper faces of the layer 22 and of the core 210 with a protective layer, preferably a dielectric, for example a layer of SiO₂.

It is then possible to carry out electrical contacts 250, 251 on the doped regions via all of the techniques that are widely known by those skilled in the art, for example by creating interconnection holes then by filling these holes with an electrically conductive material.

This method has the advantage of being simple and perfectly reproducible. It makes it possible as such to manufacture the photodiode in a simple manner and with a limited cost.

In light of the preceding description, it clearly appears that the invention proposes a simple solution that is easy to reproduce in order to increase the absorptivity of a photodiode while still reducing its length and therefore while still improving its wavelength, this without increasing the dark current and by reducing the excess multiplication noise for avalanche photodiodes.

The invention is not limited to the embodiments described hereinabove and extends to all of the embodiments covered by the claims.

The invention claimed is:

1. A photodiode, comprising:
an absorption portion, wherein the absorption portion comprises:
a sheath, comprising at least two charge extraction regions; and
a core surrounded at least partially by the sheath,
wherein the core comprises:
a plurality of patterns formed from a first material which generates, by absorption of photons, free electrical charge carriers; and
a confinement layer inside of which the patterns are located,
wherein the confinement layer is formed from a second material that is different from the first material and is made electrically conductive;
the patterns are arranged periodically along a main extension direction De (z) of the core, by having a pitch p such that:

$p \leq \lambda/4$ $\lambda$ is a smallest wavelength detected by the photodiode;
the patterns extend primarily according to a direction Dm forming with a direction Dp (x) perpendicular to the main extension direction De (z) an angle θ such that 90>θ>0, and
the photodiode is configured in such a way that a light detected is incident in the core along the main extension direction De (z).

2. The photodiode of claim 1,
wherein the pitch p is such that $$p \leq \frac{\lambda}{6}.$$

3. The photodiode of claim 1,
wherein the angle θ is such that 80>θ>5.
4. The photodiode of claim 1,
wherein the angle θ is such that 70>θ>5.
5. The photodiode of claim 1,
wherein the angle θ is such that 50>θ>15.
6. The photodiode of claim 1,
wherein the patterns are arranged periodically along the main extension direction De (z) of the core by having the pitch p such that:

$$p < \frac{\lambda}{2n_{\mathit{eff}}}.$$

$n_{\mathit{eff}}$ is an effective refractive index of a mode, and $n_{eff}$ is such that:

$$p \le \frac{\lambda}{4}.$$

7. The photodiode of claim 1,
wherein the patterns are arranged periodically along the main extension direction De (z) of the core by having the pitch p such that p≤425 nm.

8. The photodiode of claim 1,
wherein the patterns of the core are formed from an intrinsic semiconductor material,
the confinement layer is made from silicon, and
the at least two charge extraction regions are made from p- and n-doped silicon.

9. The photodiode of claim 1, forming an avalanche photodiode.

10. The photodiode of claim 1,
wherein the core and the at least two charge extraction regions are configured in such a way that a displacement of electric charge carriers in the core occurs along directions parallel to the direction Dp (x) and
the patterns have a height h, taken along the main extension direction De(z), such that 3p≥h≥0.5p.

11. The photodiode of claim 1,
wherein $$\theta \le \tan^{-1}\left(\frac{P}{W_2}\right),$$

$W_2$ is a width of the core along the direction Dp (x).

12. The photodiode of claim 1, forming an avalanche photodiode and further comprising:
a multiplication layer configured to favour multiplication of charge carriers by impact,
wherein the multiplication layer is arranged between one of the charge extraction regions and the core.

13. The photodiode of claim 1, further comprising:
a multiplication layer,
wherein the multiplication layer is directly in contact with the core and one of the charge extraction regions.

14. The photodiode of claim 1, further comprising:
a multiplication layer, and
a charge layer arranged between the multiplication layer and the core.

15. The photodiode of claim 1,
wherein the second material forming the confinement layer is based on a material forming the at least two extraction regions.

16. The photodiode of claim 1,
wherein a width $W_m$ of the patterns is equal to a width $W_2$ of the core of the absorption portion,
wherein the width $W_m$ of the patterns is measured as a projection along the direction Dp (x) and taken from one end to the other end of the pattern.

17. The photodiode of claim 1,
wherein the core of the absorption portion has a width $W_2$ measured as a projection along the direction Dp (x),
the patterns have flanks substantially parallel to the direction Dm, and
the patterns have a dimension $W_{21}$ taken, from one flank to the other flank and along the direction Dp (x) perpendicular to the main extension direction De (z), with $W_{21} \le W_2/k$, and k≥1.5.

18. The photodiode of claim 1,
wherein the patterns have flanks substantially parallel to the direction Dm, and
the patterns have a dimension $W_{21}$ taken, from one flank to the other flank and along the direction Dp (x) perpendicular to the main extension direction De (z), with $W_{21} \le p/m$, and m≥1.

19. The microelectronic device, comprising:
a plurality of the photodiodes of claim 1.

20. The photodiode of claim 1, wherein the patterns that are arranged in a periodic manner all extend in the same inclined direction Dm.

21. The photodiode of claim 1, wherein the absorption portion comprises an entrance interface configured so that the photons enter in the absorption portion through said entrance interface and wherein said entrance interface is contained in a plane (xy) perpendicular to said main extension direction De (z).

22. The photodiode of claim 1, comprising an injection portion coupled with the absorption portion and wherein the absorption portion comprises an entrance interface configured so that the photons coming from the injection portion enter the absorption portion:
through said entrance interface and
along said main extension direction De (z).

* * * * *